(12) United States Patent
Verdy et al.

(10) Patent No.: US 12,052,876 B2
(45) Date of Patent: Jul. 30, 2024

(54) MEMORY COMPRISING A MATRIX OF RESISTIVE MEMORY CELLS, AND ASSOCIATED METHOD OF INTERFACING

(71) Applicants: COMMISSARIAT À L'ÉNERGIE ATOMIQUE ET AUX ÉNERGIES ALTERNATIVES, Paris (FR); WEEBIT NANO LTD, Hod-Hasharon (IL)

(72) Inventors: Anthonin Verdy, Grenoble (FR); Gabriel Molas, Grenoble (FR); Paola Trotti, Grenoble (FR); Amir Regev, Modiin (IL)

(73) Assignees: COMMISSARIAT A L'ENERGIE ATOMIQUE ET AUX ENERGIES ALTERNATIVES, Paris (FR); WEEBIT NANO LTD, Hod-Hasharon (IL)

( * ) Notice: Subject to any disclaimer, the term of this patent is extended or adjusted under 35 U.S.C. 154(b) by 262 days.

(21) Appl. No.: 17/549,162

(22) Filed: Dec. 13, 2021

(65) Prior Publication Data

US 2022/0190037 A1    Jun. 16, 2022

(30) Foreign Application Priority Data

Dec. 16, 2020    (FR) ...................................... 2013374

(51) Int. Cl.
  *G11C 13/00*    (2006.01)
  *H10B 63/00*    (2023.01)
  *H10N 70/00*    (2023.01)
(52) U.S. Cl.
  CPC ......... *H10B 63/84* (2023.02); *G11C 13/0004* (2013.01); *G11C 13/003* (2013.01); *G11C 13/004* (2013.01); *H10N 70/821* (2023.02)

(58) Field of Classification Search
  CPC .. H10B 63/84; G11C 13/0004; G11C 13/003; G11C 13/004; G11C 2013/0045; G11C 2213/76; G11C 13/0061; H10N 70/821
  See application file for complete search history.

(56) References Cited

U.S. PATENT DOCUMENTS

2013/0329484 A1    12/2013    Tamai et al.
2016/0118115 A1*    4/2016    Ryu .................... G11C 13/0002
                                                                        365/189.07
(Continued)

FOREIGN PATENT DOCUMENTS

EP            1 642 298 B1    10/2010

OTHER PUBLICATIONS

Search Report as issued in French Patent Application No. 2013374, dated Sep. 1, 2021.

*Primary Examiner* — Jerome Leboeuf
(74) *Attorney, Agent, or Firm* — Pillsbury Winthrop Shaw Pittman LLP

(57)    ABSTRACT

A memory includes a matrix of resistive memory cells and an interfacing device to interface the matrix, the interfacing device including at least a conversion capacitor, an electric source, a first switch and a second switch, the interfacing device being configured to: a) connect the conversion capacitor to the source by the second switch to charge the conversion capacitor, then, b) disconnect the conversion capacitor from the source and connect the conversion capacitor to the matrix to achieve a conversion between, on the one hand, a resistive state of one of the memory cells of the matrix, and, on the other hand, a state of charge of the conversion capacitor.

13 Claims, 8 Drawing Sheets

(56) References Cited

U.S. PATENT DOCUMENTS

| | | | |
|---|---|---|---|
| 2016/0329810 A1* | 11/2016 | Lee | H02M 3/07 |
| 2018/0061470 A1* | 3/2018 | Di Vincenzo | G11C 11/2275 |
| 2020/0342944 A1* | 10/2020 | Sforzin | H03K 25/02 |

* cited by examiner

MEMORY COMPRISING A MATRIX OF RESISTIVE MEMORY CELLS, AND ASSOCIATED METHOD OF INTERFACING

CROSS-REFERENCE TO RELATED APPLICATIONS

This application claims priority to French Patent Application No. 2013374, filed Dec. 16, 2020, the entire content of which is incorporated herein by reference in its entirety.

FIELD

The technical field is that of microelectronics, more particularly that of resistive memories.

The present technology relates more particularly to a memory comprising a matrix of resistive memory cells and an electric interfacing device of this matrix.

BACKGROUND

New types of non-volatile memories, called resistive memories, or sometimes ReRAM (according to the acronym of "Resistive Random Access Memory"), have been developed in the last few years. A memory of this type generally comprises a matrix of memory cells, sometimes called "memory points", each storing a piece of data, for example a piece of binary data. The binary data in question is represented by the resistance level, either high, or low, of the memory cell considered. The data stored in such a memory cell can also be a piece of data that can have more than two different values (for example four different values, with the data then gathering two bits), in the case of a "multilever" memory cell. In this case, the memory cell has a resistance equal to one of its resistance levels (of which the number is greater than two), level which is associated with the value (data) stored in the cell.

Different technologies can be considered, for such memory cells. For example, they can be of the filamentary type, comprising an active layer wherein an electrically conductive filament is either broken, or on the contrary reformed to vary the resistance level of the memory cell, during the writing and then resetting cycles of this cell (SET operation, when the filament is reformed, and RESET operation, when the filament is broken again). Such a memory cell, of the filamentary type, can for example be a cell of the OxRam type (according to the acronym "Oxide Random Access Memory"), or of the CB-RAM type (according to the acronym "Conductive Bridge Random Access Memory"). The resistive memory cells in question can also be cells of the PCRAM type (for "Phase Change Random Access Memory"), wherein an amorphous-crystalline phase change is accompanied by a change in the resistance of the cell.

In any case, to access the data stored in one of the cells of the matrix, i.e. in order to read this cell, a technique consists in applying a read voltage V to the cell in question, and measuring the electrical current that, in response, flows through the cell. The value of the current then provides information on the state, either of high resistance, or of low resistance, of the memory cell. In practice, the read voltage is applied between, on the one hand, the line of the matrix where the cell to be read is located, and, on the other hand, the column of the matrix where this cell is located.

The memory cells in question are sometimes of the "1S1R" type, i.e. including, in series: a "1S" stage, playing the role of a selector and a "1R" stage corresponding to the memory element itself, wherein the data is stored (in the form of the resistance level of this element). The resistive memory element is the portion of the memory cell where the data is stored (in a non-volatile manner), in the form of a resistive state (high or low) of this element. As indicated above, this memory element can be of the filament type (OxRAM or CBRAM), or of the phase change type. When a sufficient voltage is applied at the terminals of the memory cell, the selector becomes conductive, thus making it possible to read the state of the memory element "1R". The selector is generally carried out in a portion referred to as "backend" of the electronic chip comprising the memory, i.e. in a portion of this chip fabricated during a second phase of manufacturing the chip (the memory elements can also be fabricated during this second phase, the entire matrix being part of the "backend"). Such a "1S1R" structure can manufactured by a technology of the backend type, with stacking of matrices of memory cells and of selectors. Moreover, from an electrical standpoint, this structure makes it possible to inject a current density which is generally higher than with a conventional frontend technology based on a transistor or diode. This enables to obtain a higher memory density.

But during such a read operation, it is sometimes necessary to wait a certain amount of time between the time $t'_o$ when the read voltage V starts to be applied, and the moment when the selector switches to its conductive state. And the corresponding delay is in part unpredictable, and may vary from one cell to the other, and from one reading to another in some cases, the switching can take place almost instantly, after only one or a few nanoseconds, while in other cases, the switching can occur only after about thirty or forty nanoseconds after the application of the read voltage. This phenomenon is sometimes called "incubation".

In order to suitably read the memory cell considered, the read voltage is then applied in the form of a square-wave pulse, of a relatively substantial duration $\tau'_{lect}$ (longer than the maximum value expected for the incubation time). Depending on the cases, the starting time, from which the selector becomes conductive, can be either at the beginning of this pulse (case of time $t'_2$, in FIG. 1), or rather at the end of this pulse (case of time $t'_1$, in FIG. 2).

When the selector switches to its conductive state at the beginning of the read pulse, for example at time $t'_2$, an electrical current $i'_{lect}$ flows through the memory cell during a quite long period of time (during almost the entire duration of the read pulse). This causes a substantial electrical consumption, and can also cause a kind of alteration or small scale mechanical stresses within the memory element 1R.

Phenomena comparable to the incubation phenomenon that has just been presented, for which there is a delay that is in part unpredictable before a change in the conductive or resistive state, can also occur during writing operations (or, in other words, programming) of such a memory cell.

SUMMARY

In this context, in an aspect of the invention, a memory is proposed comprising:
a matrix of resistive memory cells with:
 line electrical tracks,
 column electrical tracks, and
 resistive memory cells located at the crossings between the line electrical tracks and the column electrical tracks, each memory cell being connected between, on the one hand, one of the line electrical tracks and, on the other hand, one of the column electrical tracks, the memory comprising an interfacing device for interfacing the matrix, the interfacing device comprising at least one conversion capacitor, a voltage measuring device connected to the terminals of the conversion capacitor, an electrical source, a first switch, a second switch and a control module, the interfacing device being configured to execute the following steps:

step a): connecting the conversion capacitor to the source by means of the second switch to charge the conversion capacitor, then step b):

disconnecting the conversion capacitor from the source, and connecting the conversion capacitor between one of the line electrical tracks and one of the column electrical tracks, by means of the first switch, then acquiring a read result voltage, at the terminals of the conversion capacitor, by means of the voltage measuring device, then determining a resistive state of the cell, by the control module, based on the read result voltage.

The conversion capacitor is therefore a read capacitor, making it possible to apply to a cell to be read an electrical voltage that enables to read the cell, while still limiting the electrical energy consumed during this reading. The state of the memory cell to be read is determined from the read voltage in question, at the terminals of the capacitor after it has been connected to this cell (in practice, after it has discharged, partially, in this cell).

In step b), the conversion capacitor is disconnected from the source, and connected between the line electrical track and the column electrical track in question, by means of the first switch, in order to carry out a conversion between: on the one hand, a resistive state of the memory cell that is located at the crossing of the line electrical track and of the column electrical track, and, on the other hand, a level of charge of the conversion capacitor. The term "level of charge" means the quantity of electrical charges stored in the conversion capacitor, or, equivalently, the electrical voltage at its terminals.

This arrangement, with this conversion capacitor which somewhat plays the role of an intermediary between the electrical source and the matrix, allows for a well-controlled conversion between the two quantities mentioned hereinabove (resistive state on the one hand, and level of charge on the other hand), with a natural limitation of the transfers of energy during this conversion since the energy initially stored in the capacitor is limited (whatever the latency time for this conversion).

This makes it possible to better control the energy consumption associated with such a conversion (by limiting it to a preestablished, fixed value), as well as the energy that flows through the memory cell (energy that can be a source of premature ageing or stress for the memory cell, if it is too high).

As indicated plus haut, the conversion capacitor is employed here to carry out reading operations. The conversion in question then corresponds to a modification in the level of charge of the capacitor, i.e. of the electrical voltage at its terminals, according to the resistive state of the memory cell read. In this case, the capacitor is initially charged by the electrical source, which is then disconnected from the capacitor (thanks to the second switch). The capacitor is then connected to the matrix (between one of the lines and one of the columns, thanks to the first switch).

If the memory element of this cell is in its high resistive state, the conversion capacitor will discharge little, and will thus retain a rather high voltage. On the contrary, if the memory element is in its low resistive state, the conversion capacitor will discharge in the memory cell, and the voltage at its terminals will drop. The final voltage, at the terminals of the conversion capacitor, then provides information on the data stored in the memory cell in question.

And the electrical energy consumed during this reading operation is constant, limited (intrinsically limited by the energy initially stored in the conversion capacitor).

In particular, for memory cells of the "1S1R" type, the electrical energy consumed during the reading operation is independent of the time at which the selector "1S" becomes conductive, after the connection of the capacitor (charged beforehand) to the cell to be read. This is shown in FIG. 2. The time $t_0$ is the time at which the conversion capacitor, charged beforehand, is connected to the terminals of the memory cell to be read. After an incubation time, the selector of this cell becomes conductive, at time $t_1$. This is accompanied by a sudden increase in the current $i_1$, supplied by the capacitor and that flows through the cell. Then this current decreases, due to the discharge of the capacitor.

If the switching of the selector occurs earlier, at time $t_2$, the energy that will be consumed (and dissipated in the memory cell) will remain the same as that consumed in the case of a late switching, since it is limited by the energy initially stored in the capacitor, and by the discharge of the latter.

The problem of overconsumption mentioned hereinabove, due to the fact that the incubation phenomenon has necessarily to be taken into account (via a reading time that is sufficiently long), is therefore avoided thanks to this conversion capacitor, used somewhat as a reading intermediary of the cell.

The electrical energy consumed during such a reading operation is not only independent of the time of switching of the selector, but it can furthermore be rendered lower than the energy that would be consumed, on the average, with a reading under constant voltage, such shown by the embodiment described hereinbelow, for the purposes of illustration, in reference to FIG. 15.

In addition to the features mentioned hereinabove, the memory that has just been presented can have one or more of the following optional features, taken individually or according to all technical permissible combinations:

the interfacing device comprises an additional resistor connected in series with the conversion capacitor;

the additional resistor is greater than a line resistance of the line or column electrical track;

the conversion capacitor has a capacitance greater than a global parasitic capacitance, this global parasitic capacitance being representative of an effective electrical capacitance of the portion of the matrix corresponding to the line electrical track and to the column electrical track;

the capacitance of the conversion capacitor is comprised between two times and thirty times the global parasitic capacitance;

the control module is configured to control the first and second switches in such a way as to execute the steps a) and b) mentioned hereinabove;

the control module is configured to control the switches in such a way as not to connect the conversion capacitor simultaneously to the source and to the line and column electrical tracks;

the control module is further configured to:

in step a), control the second switch or the source in such a way as to charge the conversion capacitor to a given initialisation voltage, then in step b), control the first and second switches in such a way as to disconnect the source from the conversion capacitor then connect the conversion capacitor between the line electrical track and the column electrical track during a predetermined memory cell reading time, before the acquisition of the read result voltage;

each memory cell comprises a memory element having at least one high resistive state (one highly resistive state) and one low resistive state (one lowly resistive state), as well as a selector arranged in series with the memory element, the selector being electrically conductive when a voltage at its terminals is greater than a given threshold, and being electrically insulating otherwise; The term resistive state of the memory cell then means the resistive state (highly resistive or lowly resistive) of the memory element of the memory;

when a voltage, applied at the terminals of the memory cell, is comprised between a low voltage threshold and a high voltage threshold:
  if the memory element is in its low resistive state, then, the selector becomes electrically conductive and the memory cell then has a low memory resistance,
  while if the memory element is in its high resistive state, then, the selector remains electrically insulating and the memory cell then has a high memory resistance;

the initialisation voltage is greater than the low voltage threshold, multiplied by a load balancing compensation coefficient;

the initialisation voltage is less than the high voltage threshold, multiplied by the coefficient;

the load balancing compensation coefficient is equal to the sum of the capacitance of the conversion capacitor and of the global parasitic capacitance, divided by the capacitance of the conversion capacitor;

the reading time is greater than: a high total effective resistance, multiplied by the global parasitic capacitance, the high total effective resistance being a total effective resistance in which the conversion capacitor discharges when it is connected to the line electrical track and to the column electrical track, the memory cell, located at the crossing of this line and of this column, having its high memory resistance;

the reading time is greater than the high total effective resistance, multiplied by the global parasitic capacitance, and again multiplied by the natural logarithm of one plus the capacitance of the conversion capacitor divided by the global parasitic capacitance;

the high total effective resistance is equal to the sum of the additional resistor with the inverse of the sum of the inverse of a leakage resistance of the matrix with the inverse of the high memory resistance;

the selector is electrically conductive with the further condition that an electrical current that passes through the selector remains greater than a holding current;

the additional resistor is such that a low total effective resistance of the memory is less than the initialisation voltage divided by the holding current of the selector, the low total effective resistance being the total effective resistance in which the conversion capacitor discharges when it is connected to the line electrical track and to the column electrical track, the memory cell, located at the crossing of this line and of this column, having its low memory resistance;

the additional resistor is such that the low total effective resistance of the memory is greater than the initialisation voltage divided by a programming current of the memory element;

the additional resistor is such that the low total effective resistance of the memory is, furthermore, less than the low voltage threshold divided by the holding current of the selector;

the low total effective resistance is equal to the sum of: the additional resistor with the inverse of the sum of the inverse of the leakage resistance of the matrix with the inverse of the low memory resistance;

the conversion capacitor is located above or below the matrix of memory cells and extends parallel to the matrix, with the matrix and the conversion capacitor being superimposed on each other;

the conversion capacitor occupies a surface less than the surface occupied by the matrix of memory cells;

the conversion capacitor does not extend beyond the surface occupied by the matrix of memory cells;

the memory elements of the memory cells are of the OxRAM type (i.e.: carried out with a conductive oxide base), or of the CB-RAM type, or of the PCRAM type.

Another aspect of the present technology relates to a method for interfacing a memory such as described hereinabove, comprising the following steps:

step a): connecting the conversion capacitor to the source by means of the second switch to charge the conversion capacitor, then step b):
  disconnecting the conversion capacitor from the source, and connecting the conversion capacitor between one of the line electrical tracks and one of the column electrical tracks, by means of the first switch, then
  acquiring a read result voltage, at the terminals of the conversion capacitor, by means of the voltage measuring device, then
  determining a resistive state of the cell, by the control module, based on the read result voltage.

In particular, it can be provided that, the memory comprising a voltage measuring device connected to the terminals of the conversion capacitor:
  in step a), the second switch, or the source, is controlled in such a way as to charge the conversion capacitor to a given initialisation voltage,
  in step b), the first and second switches are controlled in such a way as to disconnect the source from the conversion capacitor, then in such a way as to connect the conversion capacitor between the line electrical track and the column electrical track, during a predetermined memory cell reading time, before the acquisition of the
  read result voltage.

The present technology and its various applications shall be better understood when reading the following description and in examining the accompanying figures.

BRIEF DESCRIPTION OF THE FIGURES

The figures are presented for the purposes of information and in no way limit the present technology.

DETAILED DESCRIPTION

Figure 3:
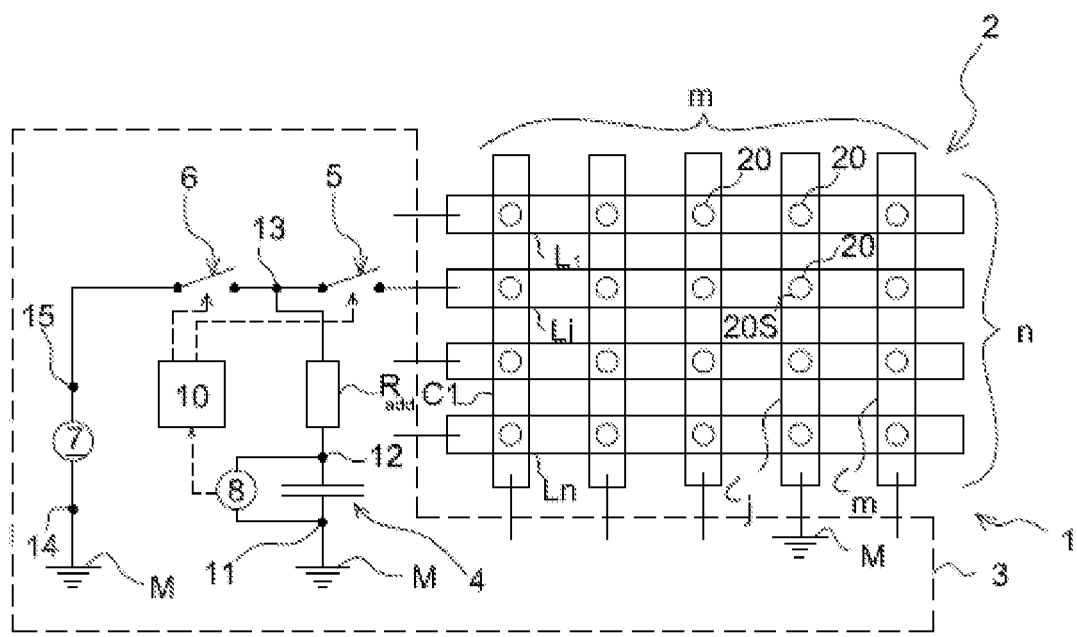
FIG. 3 schematically shows a memory comprising a matrix of memory cells as well as the interfacing device in question.

The present technology relates in particular to a memory 1, such as the one shown in FIG. 3, comprising a matrix 2 of resistive memory cells 20 arranged in n lines and m columns.

The matrix 2 comprises n line electrical tracks $L_1, \ldots, L_i, \ldots, L_n$, and m column electrical tracks $C_1, \ldots, C_j, \ldots, C_m$, for example metallic tracks. These m×n memory cells 20 are located at the crossings between the line electrical tracks and the column electrical tracks.

Each memory cell 20 is connected between, on the one hand, one of the line electrical tracks and, on the other hand, one of the column electrical tracks. Thus, to apply an electrical voltage V (for example a read voltage) to one of the memory cells, located at the crossing between one of the line electrical tracks, $L_i$, and one of the column electrical tracks, $C_j$, this electrical voltage is applied between, on the one hand, the track $L_i$, and on the other hand the track $C_j$. The cell in question, located at the crossing of these two tracks $L_i$ and $C_j$, is marked by the reference sign 20S, in FIG. 3. From an electrical standpoint, this takes place somewhat as if a first terminal of this memory cell was connected to the track $L_i$, its second terminal being connected to the track $C_j$.

Figure 4:
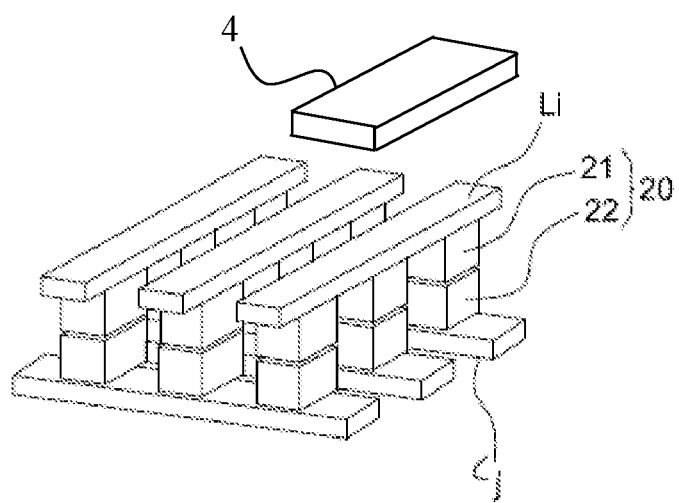
FIG. 4 is a schematical detailed view, in perspective, of a portion of the matrix of FIG. 3.

The matrix 2, and more generally the memory 1, can be fabricated by means of planar techniques, in the form of a stack of several etched and functionalised layers. As shown in FIG. 4, the column electrical tracks can then be located in a lower layer while the line electrical tracks are located in an upper layer (or inversely), the memory cells 20 (also called memory points) extending then between this lower layer and this upper layer. This type of matrix is often called matrix of the "crossbar" type, in this technical field.

Each memory cell 20 comprises a memory element 22 of which the resistance can be adjusted electrically:
either to a low resistance level, during a writing operation generally called "SET",
or to a high resistance level, during a reading operation generally called "RESET" (sometimes considered as a resetting operation).

In its low resistance state, the resistive element 20 has a low electrical resistance noted as $R_{SET}^{RRAM}$, and in its high resistive state, it has a high electrical resistance noted as $R_{RESET}^{RRAM}$. The writing operations in question are sometimes called programming operations, in this technical field.

A piece of data can be written and stored in each memory cell 20, this data being represented by the resistance level of the memory element 22. Here, the data in question is binary data, and the memory cells are programmed in such a way as to place their respective memory elements 22 either in their high resistive state, or in their low resistive state.

However, as an alternative, more than two separate levels of resistance could be used, for each memory element ("multilevel" elements), in such a way as to store in each cell a piece of data that can have more than two different values. The present technology, based in particular on a specific conversion capacitor, is presented hereinbelow in the case of memory elements with two levels but it can also be applied to multilevel memory cells such as mentioned hereinabove.

Here, the memory cells 20 are of the "1S1R" type, i.e. they comprise, in addition to the memory element 22, a selector 21 arranged in series with the memory element 22 (FIG. 4). From an electrical standpoint, the selector 21 and the memory element are connected in series, one following the other, between the two corresponding tracks $L_i$, $C_j$. The selectors 21 can be fabricated in a so-called "backend" portion of the electronic chip comprising the memory 1.

Different technologies can be considered, for the selector 21. It can be for example a selector of the MIEC type, according to the acronym "Mixed Ionic Electronic Conduction", of the MIT type ("metal-insulator transition switch") or of the OTS type (for "Ovonic Threshold Switch") which are threshold switches carried out using films made of amorphous chalcogenide alloys, such an alloy being composed of a non-oxygen chalcogenide element (S, Se, Te), in an alloy with elements such as Ge, Si, Sb, As, Al, Zn, Ga. They can be doped with light elements such as B, C, N, O, P (with concentrations in dopant that can be greater than 1% atomic).

Here, the selectors 21 are of the OTS type.

The selector 21 becomes electrically conductive when the voltage at its terminals becomes greater than a selector threshold voltage $V_{th}^{Sel}$, and which is electrically insulating otherwise. The term "electrically conductive" means that it then has a low electrical resistance RN, for example less than 30 kiloohms, or even less than 3 kiloohms. When the voltage at its terminals is less than the threshold voltage in question, the electrical resistance of the selector is clearly higher, for example in a factor $10^4$, or $10^5$ (and it varies according to the voltage, in general), and the selector is electrically insulating. The term "electrically insulating" means that it has a high electrical resistance, for example greater than 1 megohm, or even greater than 3 megohms. The selector, when it is electrically conductive, can in particular have a resistance less than the low electrical resistance $R_{SET}^{RRAM}$ of the memory element 22, while when it is electrically insulating, it can have a resistance greater than the high electrical resistance $R_{RESET}^{RRAM}$ of this element.

For the kind of selector considered here (OTS), the selector 21 is electrically conductive when the voltage at its terminals is greater than the selector threshold voltage $V_{th}^{Sel}$, and with the further condition that the current i that flows through the selector remains greater than a holding current $I_h$.

Figure 5:
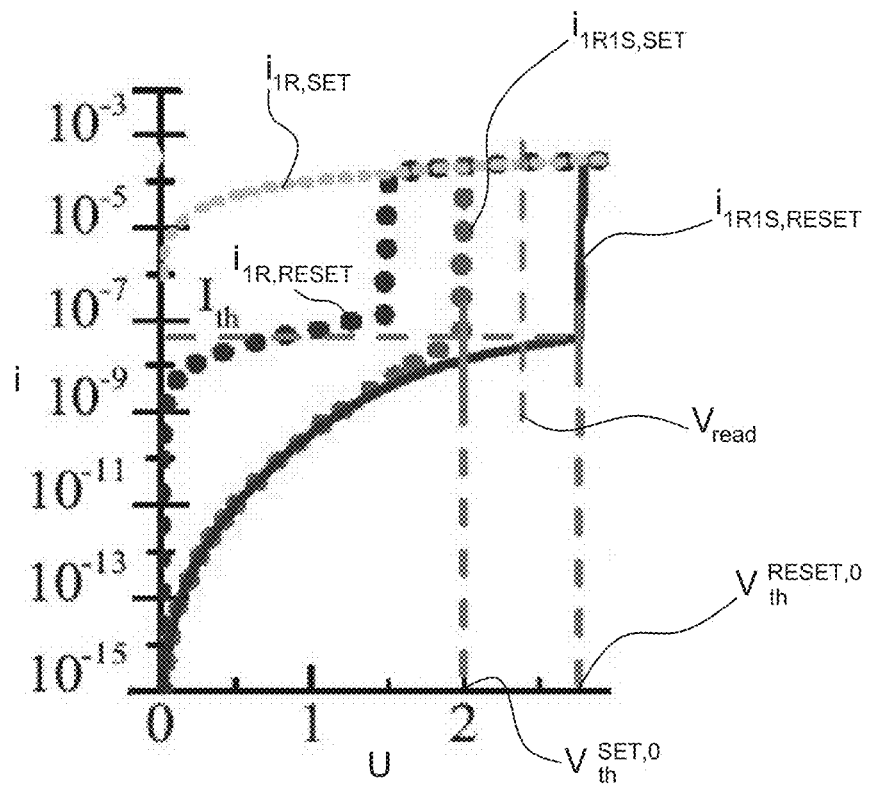
FIG. 5 schematical shows current-voltage characteristics for any of the memory cells of the matrix of FIG. 3.

FIG. 5 shows the current-voltage characteristics for the memory element 22 alone, and for the complete memory cell 20 (memory element 22+selector 21). Here, the memory element 22 is of the OxRAM type.

This figure shows the electrical current i that flows through the element considered (expressed in arbitrary units) according to the voltage U applied to its terminals (also in arbitrary units). The measurement points $i_{1R,SET}$ and $i_{1R,RESET}$ correspond to the memory element 22 alone, respectively in its low resistive state and in its high resistive state. The measurement points $i_{1R1S,SET}$ and $i_{1R1S,RESET}$ correspond to the entire memory cell, when the memory element 22 is, respectively, in its low resistive state and in its high resistive state.

When the memory element 22 is in its low resistive state and the selector 21 has not yet switched to its conductive state, the resistance of the memory element, $R_{SET}^{RRAM}$ (for example of about ten kilohms) is clearly smaller than that of the selector (the resistance of the selector, immediately below the selector threshold voltage $V_{th}^{Sel}$, is typically about a megohm). Most of the voltage U applied to the memory cell 20 is therefore applied at the terminals of the selector 21 itself (the voltage U is mainly distributed at the terminals of the selector). Thus, when this voltage becomes greater than the selector threshold voltage $V_{th}^{Sel}$, the overall resistance of the memory cell switches and the cell then has a low memory resistance $R_{cell}^{ON}=R_{SET}^{RRAM}+R_{ON}^{sel}$. In FIG. 5, the low voltage threshold $V_{th}^{SET,o}$ is therefore equal, or at least close to the selector threshold voltage $V_{th}^{Sel}$.

When the memory element 22 is in its high resistive state, its resistance $R_{RESET}^{RRAM}$ is closer to the resistance of the selector 21 immediately before switching. The voltage U applied to the memory cell is then distributed between the selector and the memory element, to the extent that a voltage U hardly greater than $V_{th}^{Sel}$ is no longer sufficient to switch the selector to its conductive state. In practice, as long as the voltage U is less than a high voltage threshold $V_{th}^{RESET,o}$, the selector then remains off. Above $V_{th}^{RESET,o}$, not only the selector switched to its conductive state, but, in addition, the memory element is to some extent rewritten, switching to its low resistive state (although it was initially in its high resistive state). When the voltage U remains less than $V_{th}^{RESET,o}$, the memory cell has a high memory resistance $R_{cell}^{OFF}$, equal to the sum of the electrical resistance $R_{RESET}^{RRAM}$ of the memory element 22 in its high resistive state, and of a resistance of the selector 21 in the off state (which, in these conditions, can be expressed as $U/I_{th}$, where $I_{th}$ is the "threshold" current that passes through the selector for a voltage immediately less than the threshold $V_{th}^{Sel}$).

In any case, for the complete memory cell 20, when the voltage U is comprised between the low voltage threshold $V_{th}^{SET,o}$, and the high voltage threshold $V_{th}^{RESET,o}$, it has a resistance which is either $R_{cell}^{ON}$, or $R_{cell}^{OFF}$, according to the low or high resistive state of the memory element itself, and which is therefore representative of the data (0 or 1) stored in the memory cell. A voltage comprised within this range thus allows for a reading of this data, without risking rewriting the cell during this reading (or at least with a low risk of rewriting, or, in other words, of erasure).

The different memory cells 20 of the matrix can, from the standpoint of their operating characteristics (voltage thresholds, levels of resistance, etc.), have a certain disparity in relation to one another, whether it is immediately after the manufacture and commissioning of the memory, or later, due to a different ageing between cells. In any case, during the controlling of the memory 1, it is desirable to take this disparity into account.

Figure 6:
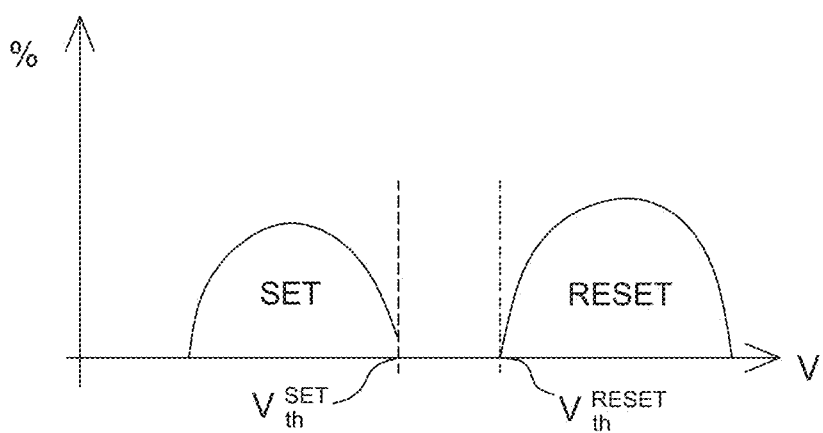
FIG. 6 schematical shows a threshold voltage distribution, for the cells of the memory of FIG. 3.

FIG. 6 diagrammatically shows the way in which the low voltage thresholds, and the high voltage threshold are distributed among the different cells of the matrix 2. In this figure, the voltages are represented in X-coordinates, while the proportion of cells that have a given low, or high, voltage threshold, is represented in Y-coordinates, in correspondence with the voltage value in question.

In this figure, in the distribution of low voltage thresholds, the larger of these thresholds is marked by the reference $V_{th}^{SET}$. In all that follows, the expression "low voltage threshold" designates the quantity $V_{th}^{SET}$. In a comparable way, in the distribution of high voltage thresholds, the smallest of these thresholds is marked with the reference $V_{th}^{RESET}$, and, in all that follows, the expression "high voltage threshold" designates the quantity $V_{th}^{RESET}$.

In light of this distribution, a read voltage comprised between $V_{th}^{SET}$ and $V_{th}^{RESET}$ clearly makes it possible to read any of the memory cells of the matrix without risking rewriting it (or at least with a low risk of rewriting).

In any case, regardless of the type of selector used, each memory cell 20 is such that, here, when a voltage is applied at the cell terminals comprised between:
- a low voltage threshold, here the low voltage threshold $V_{th}^{SET}$, and
- a high voltage threshold, here the high voltage threshold $V_{th}^{RESET}$, then:
- the high resistive or low resistive state of the resistive element 22 is not modified, and
- the memory cell 20 has either its high memory resistance $R_{cell}^{OFF}$, or its low memory resistance $R_{cell}^{ON}$, according to the high or low resistive state of the resistive element 22.

The memory 1 comprises an interfacing device 3 for interfacing the matrix 2, in addition to the matrix 2.

Here, the interfacing device 3 makes it possible to address such or such memory cell of the matrix, i.e. to connect it electrically (by a system of switches) to an electrical circuit for controlling the cell, in order to interact with it.

More particularly, the interfacing device 3 comprises at least (FIG. 3):
- a conversion capacitor 4,
- a first switch 5, arranged in the interfacing device to, upon command:
  - either connect the conversion capacitor 4 between one of the line electrical tracks $L_i$ and one of the column electrical tracks $C_j$ of the matrix 2, or disconnect the conversion capacitor from the electrical tracks $L_i$, $C_j$, an electrical source, 7, and a second switch 6 arranged in the interfacing device to, upon command:

either connect the electrical source to the terminals of the conversion capacitor, or disconnect the source 7 from the conversion capacitor 4.

The switches 5 and 6 are transistors, for example. The source 7 is able to charge the conversion capacitor 4. Here, this is a voltage source (for example in the form of a voltage regulator, itself electrically powered). Alternatively, it could be a source of current, or any source that can deliver an arbitrary current and voltage. The first switch 5 is connected between the conversion capacitor 4 and one of the line electrical tracks, or one of the column electrical tracks of the matrix. The second switch 6 is connected between the conversion capacitor and the source 7.

The conversion capacitor 4 allows for a conversion between:

on the one hand, a resistive state of the memory cell 20S to which the conversion capacitor 4 is connected, and on the other hand, a state of charge of the capacitor, here a voltage at the terminals of the capacitor.

This arrangement, with this conversion capacitor 4 which somewhat plays the role of an intermediary between the source 7 and the matrix 2, allows for a well-controlled conversion between the two quantities mentioned above (resistive state on the one hand, and state of charge on the other hand), with a natural limitation of the transfers of energy during this conversion since the energy initially stored in the capacitor is limited (the capacitor having a limited electrical capacitance).

This makes it possible in particular to better control the energy consumption associated with such a conversion (by limiting it to a preestablished fixed value), as well as the energy that flows through the memory cell (energy that could be the source of a premature ageing, or of stress for the memory cell, if it is too high).

Moreover, such as shown, the interfacing device 3 comprises a control module 10 arranged to control the first and second switches 5, 6, the control module being configured to control these switches in such a way as to connect the conversion capacitor 4 simultaneously to the source 7 and to the line and column electrical tracks $L_i$, $C_j$, precisely so that the conversion capacitor 4 fully plays its role of intermediary between the source 7, and the cell 20S addressed by the interfacing device 3.

The control module 10 is carried out for example in the form of an electrical circuit, for example a programmable electrical circuit, supplying the switches with control signals according to a predetermined temporal sequence. The control module is for example integrated on the same electronic chip as the matrix, just as the other components of the interfacing module 3.

As can be seen in FIG. 3, the interfacing device 3 also comprises an additional resistor $R_{add}$, here. This resistor is connected in series with the conversion capacitor 4, between this capacitor and the line electrical track $L_i$ (alternatively, it could be connected between the conversion capacitor and the column electrical track $C_j$, for example).

This additional resistor makes it possible, through the choice of its value, to limit the maximum electrical current supplied to the matrix, by the conversion capacitor, which makes it possible to control even better the electrical exchanges, during the controlling of the matrix. The additional resistor is in particular greater than the line resistance of the line or column electrical track $L_i$, $C_j$. The additional resistor $R_{add}$ is carried out here in the form of a dedicated electrical component (made of resistive material). Alternatively, this resistor could however be the internal resistance (effective resistance) of the first switch 5 in its ON state.

The structure of the interfacing device 3, such as shown in FIG. 3, is now described in more detail.

A first terminal 11 of the conversion capacitor 4 is connected to the column electrical track $C_j$, via an electrical ground M. The column electrical track $C_j$ is electrically connected to the ground M, and the first terminal 11 of the conversion capacitor is also electrically connected to this electrical ground.

A second terminal 12 of the conversion capacitor 4 is connected to the line electrical track $L_i$, via the additional resistor $R_{add}$ and of the first switch 5. Here, the additional resistor $R_{add}$ is electrically connected between, on the one hand, the second terminal 12 of the capacitor, and, on the other hand, an intermediate terminal 13. The first switch is electrically connected between this intermediate terminal 13 on one hand and the line electrical track $L_i$ on the other hand.

A first terminal 14 of the source 7 is connected to the ground M, while a second terminal 15 of this source is connected to the intermediate terminal 13, via the second switch 6 (the second switch 6 is connected between the second terminal 15 of the source on the one hand, and the intermediate terminal 13 on the other hand).

The interfacing device 3 also comprises a voltage measuring device 8, connected between the first and second terminals 11, 12 of the conversion capacitor 4. This device is able to measure the voltage at the terminals of the conversion capacitor 4, or, at least, is able to compare it with a given predetermined threshold. It is connected to the control module 10 and is able to communicate to it the result of this voltage measurement, or of this comparison.

As those skilled in the art can realise, different alternatives, compatible with the function of the conversion capacitor 4 mentioned hereinabove, can be made to the conversion device 3. Thus, the roles of the line and column electrical tracks $L_i$ and $C_j$ could be inversed, for example (the column electrical track then being connected to the conversion capacitor by the first switch, while the line electrical track would then be connected to the ground M). The second switch 6 could also be connected between the second terminal 15 of the source 7 and the second terminal 12 of the capacitor, for example, rather than connecting it between the second terminal 15 of the source 7 and the intermediate terminal 13.

The interfacing device 3 can in particular by used, like here, to carry out reading operations of the memory cells of the matrix.

For this, the control module 10 is configured (for example programmed) to execute the following operations:

controlling the first and second switches 5, 6 to connect the source 7 to the conversion capacitor 4, the conversion capacitor then being disconnected from the line and column electrical tracks $L_i$ and $C_j$ (one of its two terminals could however remain connected to one of these tracks), in such a way as to charge the conversion capacitor to a given initialisation voltage $V^{init}$, then controlling the first and second switches 5, 6 to disconnect the source 7 from the conversion capacitor 4 and connect the conversion capacitor between the line electrical track $L_i$ and the column electrical track $C_j$, the conversion capacitor then remaining connected between these two electrical tracks during a predetermined memory cell reading time, $t_{meas}$, then acquiring a read result voltage $V_R$, at the terminals of the conversion capacitor 4, by means of the voltage measuring device 8.

The read result voltage, acquired by the voltage measuring device 8 can be measured by the voltage measuring device 8 (which then delivers a value, for example in the form of numerical, logic data), or more simply compared to a given threshold (which constitutes a simplified form of measurement), the result then taking the form of a high, or low electrical signal, according to the result of the comparison, for example.

Figure 11:
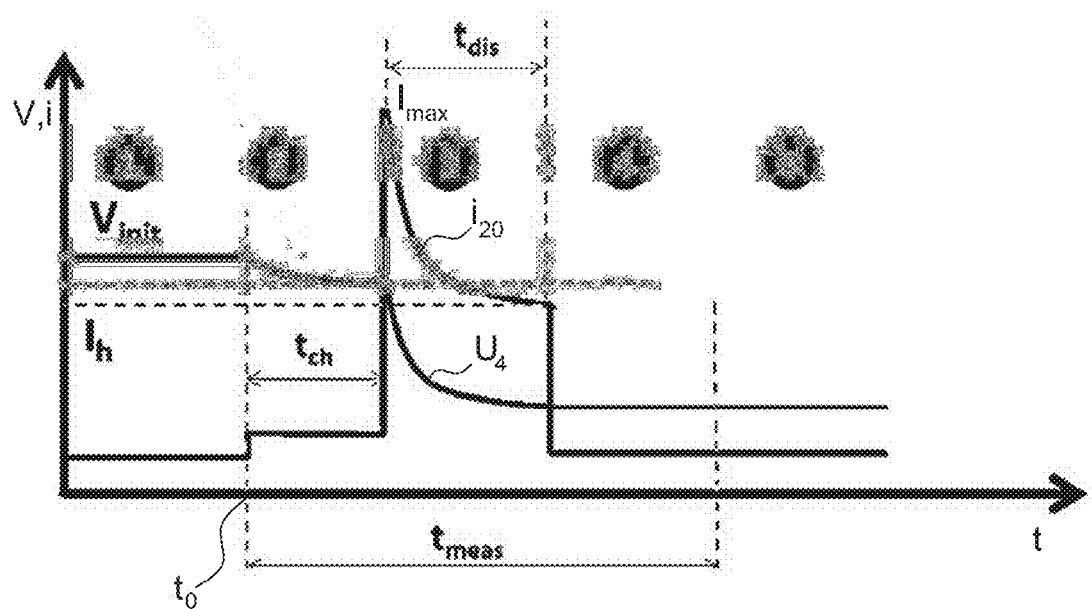
FIG. 11 shows the temporal change in the voltage at the terminals of the conversion capacitor during a reading operation of a low resistive state.

If the memory element 22 of the selected memory cell 20S (located at the crossing of $L_i$ and $C_j$) is in its high resistive state, the selector will not switch to its conductive state, and the conversion capacitor 4 discharges very little during the reading time $t_{meas}$, thus retaining a high voltage. On the contrary, if the memory element is in its low resistive state, the selector will switch to its conductive state, and the conversion capacitor 4 will discharge in the low memory resistance $R_{cell}^{ON}$, the voltage at its terminals then falling notably (FIG. 11). The read result voltage $V_R$, measured finally at the terminals of the conversion capacitor 4, therefore provides information on the data (0 or 1) stored in the memory cell in question.

And, as explained in the part entitled "Summary", the electrical energy consumed during this reading operation is intrinsically limited, independently of the time at which the selector switches to its conductive state. the problems due to the incubation phenomenon mentioned hereinabove are thus overcome.

Figure 7:
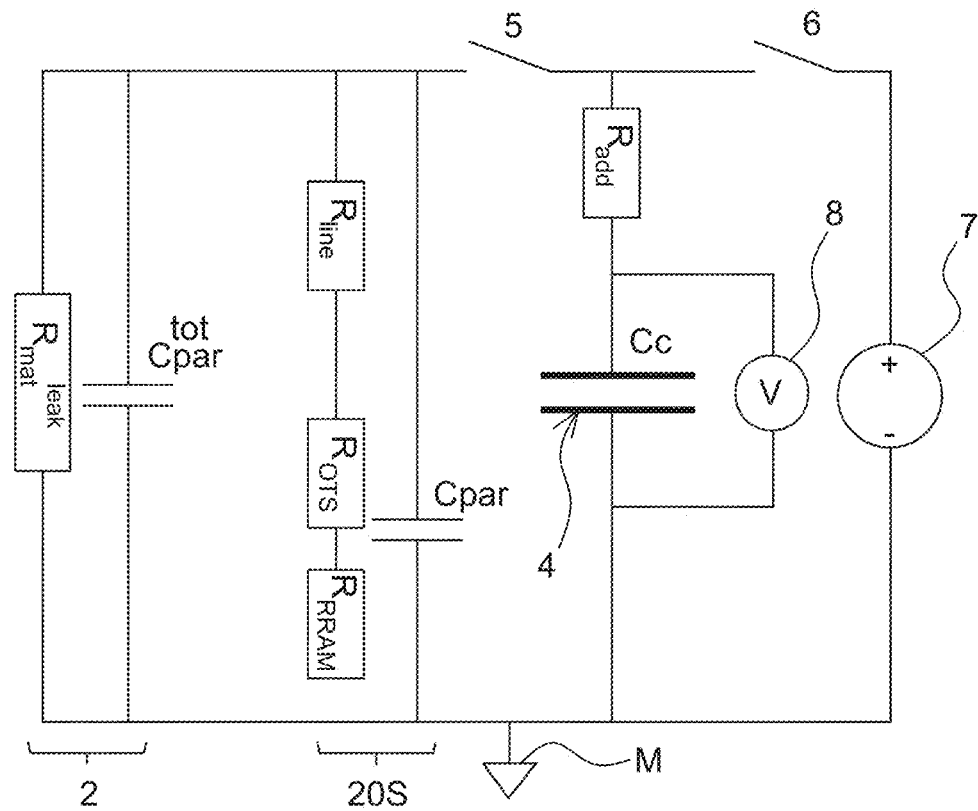
FIG. 7 is an equivalent electrical diagram modelling the electrical behaviour of a portion of the memory during a reading operation of one of the cells.

In what follows, operating characteristics (response time, values of voltage, etc.) of the interfacing device 3, expected for such a reading operation shall be presented, in the framework of a slightly simplified modelling of this operation corresponding to the equivalent electrical diagram of FIG. 7.

Criteria for dimensioning the components of the interfacing device (capacitance $C_c$ of the conversion capacitor 4, value of the additional resistor $R_{add}$, etc.) shall then be presented which, in light of the operating characteristics in question, are well suited for this reading operation.

A numerical example shall then be presented, as well as an illustration of the influence of the value of the capacitance $C_c$ on the performance of the memory and on the size of the device.

Modelling

FIG. 7 shows an equivalent electrical diagram of the memory 1, during a reading operation of the memory cell 20S. In addition to the components (4 to 8) of the interfacing device 3, presented hereinabove, this figure shows a model representing in a simplified manner the electrical behaviour of the memory cell 20S read, and that of the rest of the matrix 2.

The memory cell (and a part of the rest of the matrix) are modelled by:
  a set of three resistors $R_{line}$, $R_{OTS}$ and $R_{RRAM}$ connected in series to one another, this set being connected between the ground M and the first switch 5, and
  a capacitor having a parasitic capacitor $C_{par}$, connected in parallel with this set of resistors.

The resistor $R_{line}$ is the electrical resistance of the electrical tracks $L_i$ and $C_j$. In practice, it is clearly smaller than $R_{OTS}$ and $R_{RRAM}$ which are, respectively, the resistance of the selector 21 and the resistance of the memory element 22.

The rest of the matrix is represented by a leakage resistance of the matrix, $R_{mat}^{leak}$, and a global parasitic capacitance $C_{par}^{tot}$ connected in parallel with the leakage resistance, the whole being connected between the ground M and the first switch 5.

The global parasitic capacitance $C_{par}^{tot}$ is representative of an effective electrical capacitance of the portion of the matrix 2 that comprises the line and the column of memory cells 20 corresponding to the line electrical track $L_i$ and to the column electrical track $C_j$, without the memory cell 20S (located at the crossing of this line and of this column). This is therefore the effective parasitic capacitance of the (m+n−1) memory cells in question.

Figure 8:
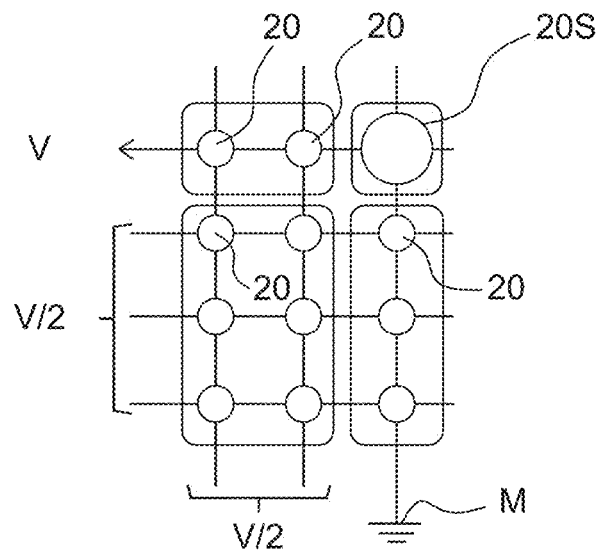
FIG. 8 shows a so called "V/2" polarisation configuration of the matrix used during reading operations.

The capacitance of these cells must betaken into account, to determine the electrical behaviour of the memory (for example the response times), even if these cells are not read, during the reading operation in question. Indeed, during the reading of such and such cell of the matrix, the other cells are also polarised (in order to not leave them at a floating potential), but in such a way as to apply a voltage to them that remains less than the read voltage (in order to not switch their selectors to the conductive state). A polarisation configuration of the so called "V/2" matrix is diagrammatically shown in FIG. 8. It can easily be seen that, in this configuration, the (m+n−2) cells of the line $L_i$ and of the column $C_j$, other than the target cell 20S, are polarised under a voltage V/2, while the cell 20S is polarised under a voltage V. And as these (m+n−2) cells are polarised, powered, their capacitance must be taken into account to determine the electrical response (in particular the response time) of the whole.

Here, for this polarisation configuration, the global parasitic capacitance $C_{par}^{tot}$ can be evaluated as being equal to $(m+n-1) \times C_{par}$. Note that m+n−1 is the total number of cells (including the cell 20S) that the line $L_i$ and the column $C_j$ comprises. For other polarisation configurations (for example the configuration called "V/3" in literature), the expression of $C_{par}^{tot}$ can however be different.

Regarding the leakage resistance $R_{mat}^{leak}$, it is considered here that it is given by the following relationship:

$$R_{mat}^{leak} = \left[ \left( \frac{I_{leak}}{Vleak} + \frac{1}{Rline} + \frac{1}{R_{RESET}^{RRAM}} \right) \times (m+n-2) \right]^{-1}$$

where $I_{leak}$ is a leakage current of a cell of the matrix subjected to the voltage $V_{leak}$ (for example V/2).

Moreover, in this model, the following is neglected:
  the parasitic capacitor of the circuitry external to the matrix,
  the influence of the current on the resistance of the selector (also called OTS in what follows) in its on (conductive) state; this resistance, $R_{ON}^{sel}$, is assumed to be constant,
  the influence of the change in the voltages (during the discharge of the conversion capacitor) on the leakage currents; constant and maximum currents are considered (as it is the most unfavourable case).

It is moreover assumed:
  as already indicated, a polarisation configuration of the matrix of the "V/2" type,
  that the leakage currents come only from the (m+n−1) partially selected cells,
  that a single memory cell is read at a time.

Operating Characteristics

In this context, it was determined, for the read operation described hereinabove, the change over time t:

of the voltage $U_4$ at the terminals of the conversion capacitor 4, of the voltage $U^{SET}_{20}$ and $U^{RESET}_{20}$ at the terminals of the memory cell 20S, and of the current $i_{20}$ that flows through the cell 20S.

Figure 9:
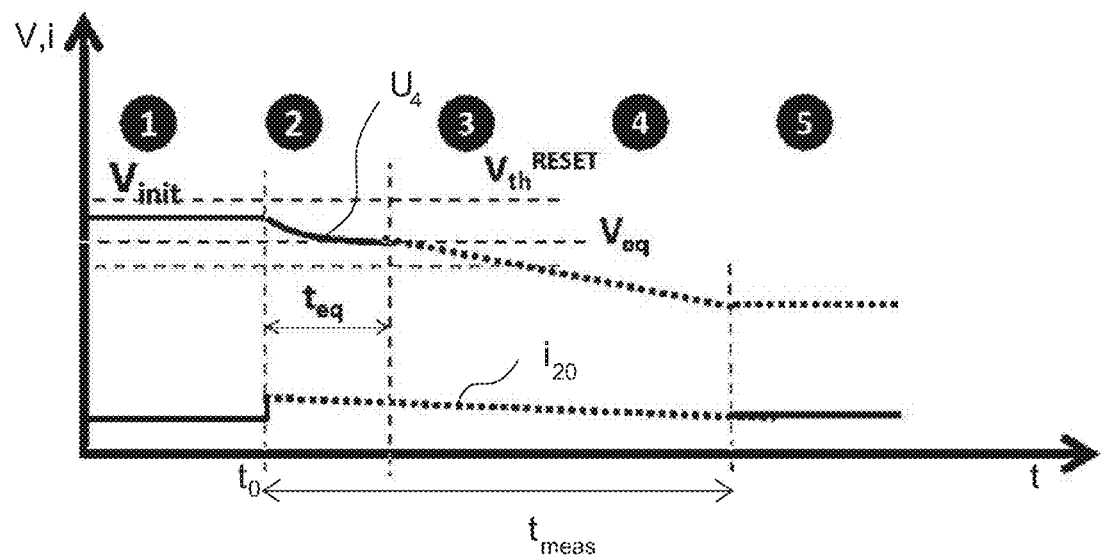
FIG. 9 shows the temporal change in the voltage at the terminals of a conversion capacitor of the memory, during a reading operation of a high resistive state.
Figure 10:
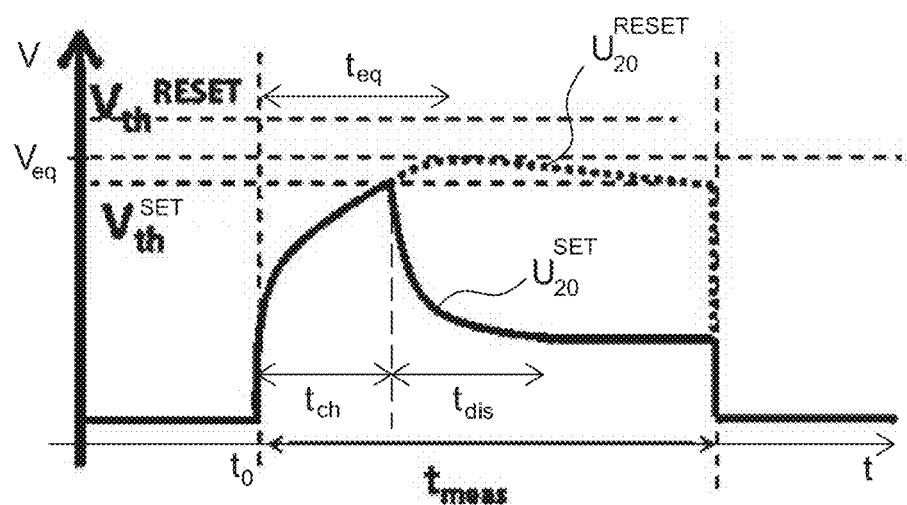
FIG. 10 shows the temporal change in the voltage at the terminals of the cell read, during the reading operation corresponding to FIG. 9.

The temporal change in these quantities is diagrammatically shown in FIGS. 9 to 11.

FIG. 9 shows the change over time t in the voltage $U_4$ when the memory element of the cell 20S is in its high resistive state (RESET).

The conversion capacitor 4 was charged beforehand, to an initial voltage $V_{init}$, by the source 7. The source is then disconnected (thanks to the second switch 6). Then, at time $t_o$, at the end of a first phase (phase "1", in the figures), the conversion capacitor 4 is connected to the matrix by closing the first switch 5.

The electrical charge initially contained in the conversion capacitor 4 is then distributed between this capacitor and the parasitic capacitors mentioned hereinabove. During this second phase (phase "2" in the figures), the voltage $U^{RESET}_{20}$ at the terminals of the memory cell 20S increases progressively (FIG. 10) while the voltage $U_4$ decreases, with these two voltages finally reaching the same equilibrium voltage $V_{eq}$.

This equilibrium voltage $V_{eq}$, fixed by the charge distribution in question, is therefore expressed as:

$$V_{eq} = V_{init} \frac{1}{1 + C^{tot}_{par}/C_c}$$

The duration $t_{eq}$ for reaching this equilibrium voltage is expressed as:

$$t_{eq} = -\ln(1 - V_{eq}/V_{init}) \times R^{OFF}_{tot} \cdot C^{tot}_{par}$$

where $R^{OFF}_{tot}$ is a high total effective resistance wherein the conversion capacitor 4 discharges.

The resistance $R^{OFF}_{tot}$ is therefore expressed here as:

$$R^{OFF}_{tot} = (1/(1/R^{mat}_{leak} + 1/R'^{OFF}_{cell})) + R_{add}$$

where $R'^{OFF}_{cell}$ is the sum of the high memory resistance $R^{Off}_{cell}$ of the cell and of the line resistance $R_{line}$ (the latter being generally negligible, in practice).

It can be expressed as:

$$R^{OFF}_{cell} = \frac{V_{init}}{I_{th}} + R^{RRAM}_{RESET} + R_{line}$$

where $V_{init}/I_{th}$ is an estimation of the resistance of the selector 21, in its off state, in these operating conditions.

Then, during a third phase (phases "3" and "4" in FIG. 9), the voltage at the terminals of the conversion capacitor 4 decreases progressively (as well as that, $U^{RESET}_{20}$, at the terminals of the cell 20S), due to the current leakage mentioned hereinabove.

At the end of the measuring time $t_{meas}$, the read result voltage $V_R$ is then equal to a voltage $V^{RESET}_{read}$, that, supposing that $t_{meas}$ is greater than $t_{eq}$, can be expressed as:

$$V^{RESET}_{read} = V_{eq} \times (1 - \exp[-t_{meas}/\tau_{off}])$$

where $\tau_{off} = R^{OFF}_{tot} \times (C_c + C^{tot}_{par})$ is the response time of the circuit RC equivalent to the memory, in this situation.

FIG. 11 shows the change overtime t of the voltage $U_4$ when the memory element of the cell 20S is in its low resistive state (SET).

The conversion capacitor 4 is charged beforehand to the initial voltage $V_{init}$, as described hereinabove, during the first phase (phase "1", in the figures). A the time to, at the end of the first phase, the conversion capacitor 4 is connected to the matrix by closing the first switch 5.

As in the case of a high resistive memory element, the electrical charge initially contained in the conversion capacitor 4 then begins by being distributed between this capacitor and the parasitic capacitors during a second phase (phase "2" in the figures), the voltage $U^{SET}_{20}$ at the terminals of the memory cell 20S increasing progressively tending towards the equilibrium voltage $V_{eq}$. (FIG. 10).

But, as the resistive element 22 is in its low resistive state, when the voltage $U^{SET}_{20}$ reaches the low voltage threshold $V^{SET}_{th}$, the selector 21 switches to its conductive state, thus initiating a third phase, "3", of a rapid discharge of the conversion capacitor.

The duration $t_{ch}$ of the second phase is expressed as:

$$t_{ch} = -\ln(1 - V^{SET}_{th}/V_{init}) \times R^{OFF}_{tot} \cdot C^{tot}_{par}$$

During the third phase, the conversion capacitor 4 discharges rapidly in the memory cell 20S, which has the low memory resistance $R^{ON}_{cell}$. This discharge persists as long as the current $i_{20}$ that is flowing through the cell remains greater than the holding current $I_h$. When $i_{20}$ becomes less than or equal to $I_h$, the selector switches back to its off state and the current $i_{20}$ is then highly reduced, which marks the end of the third phase.

The maximum value $I_{max}$ reached by the current $i_{20}$, at the beginning of the third phase (i.e.: immediately after the switching of the selector in its conductive state), can be expressed as $I_{max} = V_{init}/R^{ON}_{tot}$, where $R^{ON}_{tot}$ is a low total effective resistance wherein the conversion capacitor 4 discharges.

The resistance $R^{ON}_{tot}$ can be expressed as $$R^{ON}_{tot} = 1/(1/R^{mat}_{leak} + 1/R'^{ON}_{cell}) + R_{add}$$

where $R'^{ON}_{cell}$ is equal to the sum of the low memory resistance $R^{ON}_{cell}$ of the cell, and of the line resistance $R_{line}$ (the latter being generally negligible, in practice):

$$R'^{ON}_{cell} = R^{ON}_{cell} + R_{line} = R^{sel}_{ON} + R^{RRAM}_{SET} + R_{line}$$

Different precautions are to be taken concerning the maximum current $I_{max}$.

Firstly, it is desirable that the maximum current $I_{max}$ be less than a programming current of the cell, $I_{prog}$, beyond which there is a risk of modifying the resistive state of the memory element 22, which results in:

$$V_{init}/R^{ON}_{tot} < I_{prog} \tag{F1}$$

The additional resistor $R_{add}$ makes it possible, in a particularly convenient way, to adjust the value of the low total effective resistance $R^{ON}_{tot}$, so as to satisfy the condition (F1) hereinabove. This possibility of adjusting $R^{ON}_{tot}$, thanks to the additional resistor $R_{add}$, is particularly beneficial for a memory of the OxRAM type, such as the one described here, for which the maximum read current is often rather close to the programming current.

It is also desirable that the maximum current $I_{max}$ be greater than the holding current $I_h$, in order to effectively switch the selector to its conductive state, or $$V_{init}/R^{ON}_{tot} > I_h \tag{F2}$$

More generally, it is beneficial that the discharge current be high (without however exceeding $I_{prog}$), in order to discharge the conversion capacitor as much as possible before the selector turns off. This indeed allows for a substantial drop in the voltage at the terminals of the capacitor, and therefore a more substantial difference between the read result voltage for a high resistive state and for a low resistive state.

Figure 11B:
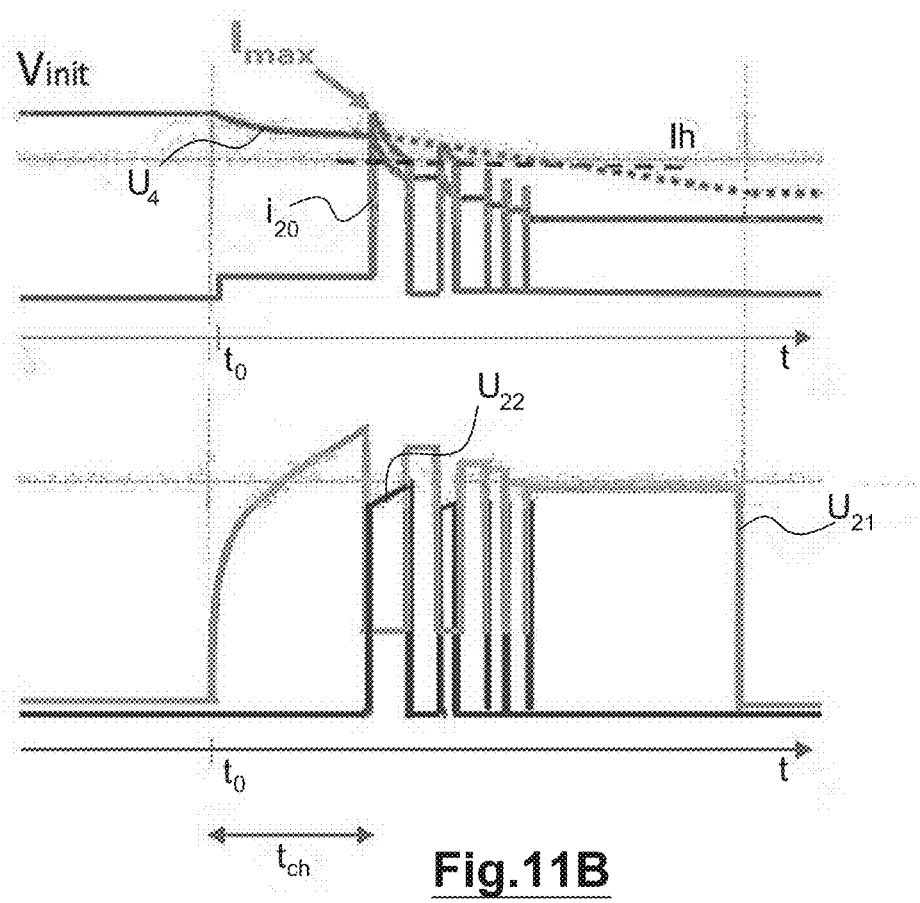
FIG. 11B shows an oscillation phenomenon that may occur in some cases, during a reading operation of a low resistive state.

It is desirable moreover to discharge the conversion capacitor a minimum in order to prevent a phenomenon of oscillations between the conversion capacitor and the memory cell. Indeed, if the conversion capacitor is not sufficiently discharged when the selector turns off, this capacitor will then charge (by charge distribution) the parasitic capacitors of the memory, thus causing the voltage at the terminals of the cell to pass again to a value greater than $V_{th}^{SET}$ and thus resulting in another switching of the selector to its conductive state, which will make the conversion capacitor discharge until the selector turns off, and so on until the conversion capacitor is sufficiently discharged, with its residual charge no longer sufficient to reach $V_{th}^{SET}$ at the terminals of the memory cell. This oscillation phenomenon is shown in FIG. 11B, which shows the change over time t of $U_4$ and $i_{20}$, as well as the voltage $U_{21}$ at the terminals of the selector 21 alone, and the voltage $U_{22}$ at the terminals of the memory element 22 alone. These oscillations are undesirable, if only because they prolong the reading operation. In order to prevent them, it is desirable to reach, at the end of the first discharge (when the selector goes off), a voltage that is sufficiently low at the terminals of the conversion capacitor, which results in:

$$R_{tot}^{ON} < V_{th}^{SET}/I_h \tag{F3}$$

Again, adjusting the value of the additional resistor $R_{add}$ makes it possible to conveniently adjust the value of $R_{tot}^{ON}$ so as to satisfy this condition.

Now regarding the duration $t_{dis}$ of the third phase, it can be expressed as:

$$t_{dis} = -\ln\left(\frac{I_h \times R_{tot}^{ON}}{V_{th}^{SET}}\right) \times \tau_{ON}$$

where $\tau_{ON} = R_{tot}^{ON} \times (C_c + C_{par}^{tot})$ is the response time of the circuit RC equivalent to the memory, in this situation.

At the time the selector turns back off, at the end of the third phase, the conversion capacitor has at its terminals a voltage $V_{read}^{SET}$ that can be expressed as:

$$V_{read}^{SET} = V_{th}^{SET} \cdot \exp(-t_{dis}/\tau_{ON}) = I_h \times R_{tot}^{ON}$$

In order to obtain a read result voltage as low as possible, it is desirable to reach the end of this third phase before disconnecting the conversion capacitor from the matrix and measuring the voltage at its terminals. It is therefore desirable that the reading time $t_{meas}$ is greater than the sum of $t_{ch}$ and of $t_{dis}$:

$$t_{meas} > t_{meas,min} = t_{ch} + t_{dis} \tag{F4}$$

It can even be provided that the reading time $t_{meas}$ be greater than the sum of the duration $t_{meas,min}$ and of a maximum expected incubation duration $t_{incub}$.

A fourth phase "4" of the reading operation begins when the selector switches back to its off state, and ends at the end of the reading time $t_{meas}$, when the read capacitor is disconnected from the matrix (so as to measure the read result voltage, during a fifth phase "5").

Here, it is considered that, during the fourth phase, the drop in voltage at the terminals of the conversion capacitor due to the leakage currents is negligible. Indeed, the electrical voltage applied to the line $L_i$ is then substantially reduced (due to the preceding discharge of the capacitor).

The read result voltage $V_R$ obtained finally at the end of the fourth phase is therefore equal, or at least close to the voltage $V_{read}^{SET}$ a at the end of the third phase.

Finally, the difference $\Delta V_R$ between: the read result voltage $V_R$ for a memory element in its high resistive state, and the read result voltage $V_R$ for a memory element in its low resistive state is then expressed as $\Delta V_R = V_{read}^{RESET} - V_{read}^{SET}$.

Dimensioning

In light of the expected operation for the memory 1, it appears useful to dimension the components of the interfacing device 3 in accordance with the conditions given below.

The interest of these dimensioning conditions is illustrated by the analysis of the operation of the device, presented above, based on the simplified electrical model of the memory. But, as shall appear to those skilled in the art, the general behaviour and trends thus illustrated are not limited to the framework of the simplified analysis in question, and the dimensioning conditions in question have an interest beyond the framework of this simplified electrical model.

Firstly, it can be noted that, in order to reach (at the terminals of the cell 20S) a voltage greater than the low voltage threshold $V_{th}^{SET}$, at the end of the phase "2" of charge distribution (and thus be in a position to suitably read the memory cell), it is desirable that the initial voltage $V_{init}$ and the capacitance $C_c$ of the conversion capacitor 4 satisfy the following condition:

$$V_{init} \geq V_{th}^{SET} \times \alpha \tag{F5}$$

where $\alpha = (C_c + C_{par}^{tot})/C_c$ is a load balancing compensation coefficient.

Moreover, in order to prevent the risk of rewriting the memory cell during the reading thereof, it is desirable to check the following condition (so that the voltage at the terminals of the cell remains less than the high voltage threshold $V_{th}^{RESET}$):

$$V_{init} \leq V_{th}^{RESET} \times \alpha \tag{F6}$$

Figure 13:
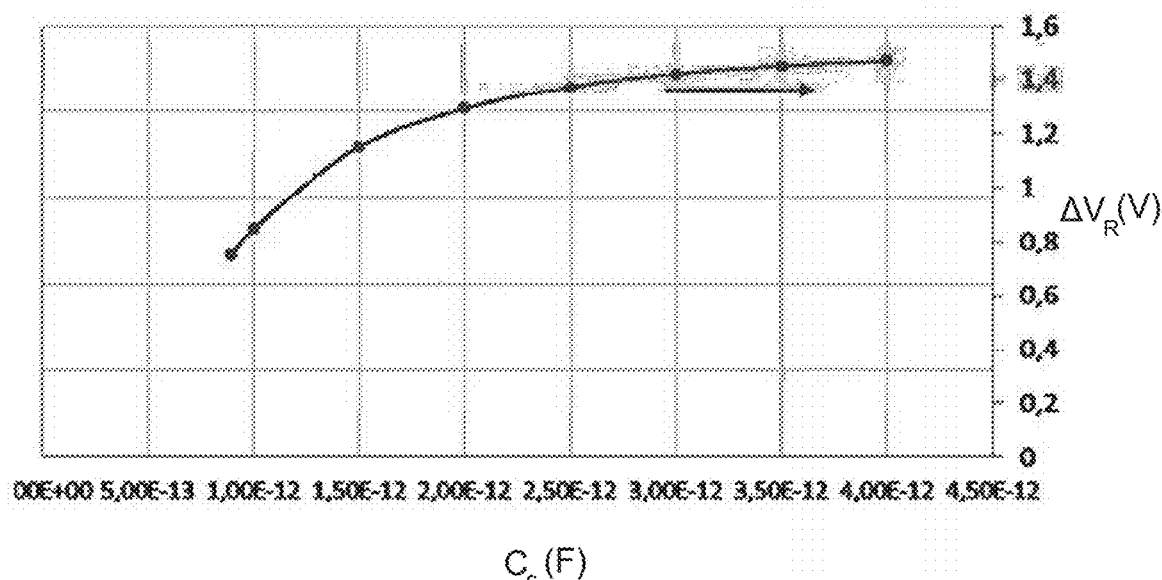
FIG. 13 shows how the width of a read window varies, as a function of the capacitance of the conversion capacitor.

In order to be able to work with an initial voltage $V_{init}$ that is not excessively high, if possible of the same order of magnitude as the voltage thresholds of the memory cells (in other words, in order to have a coefficient $\alpha$ that is not too high), it is therefore desirable that the capacitance $C_c$ of the conversion capacitor be higher, and even clearly higher than the global parasitic capacitance $C_{par}^{tot}$. This is moreover desirable for the entire operation of the memory 1. FIG. 13 shows more precisely, for an example, the influence of the value of capacitance $C_c$ on the width $\Delta V_R$ of the "Window" between high and low read voltages, showing that it is desirable to choose the capacitance $C_c$ that is high enough (with respect to $C_{par}^{tot}$) to obtain a read window that is sufficiently wide.

Figure 14:
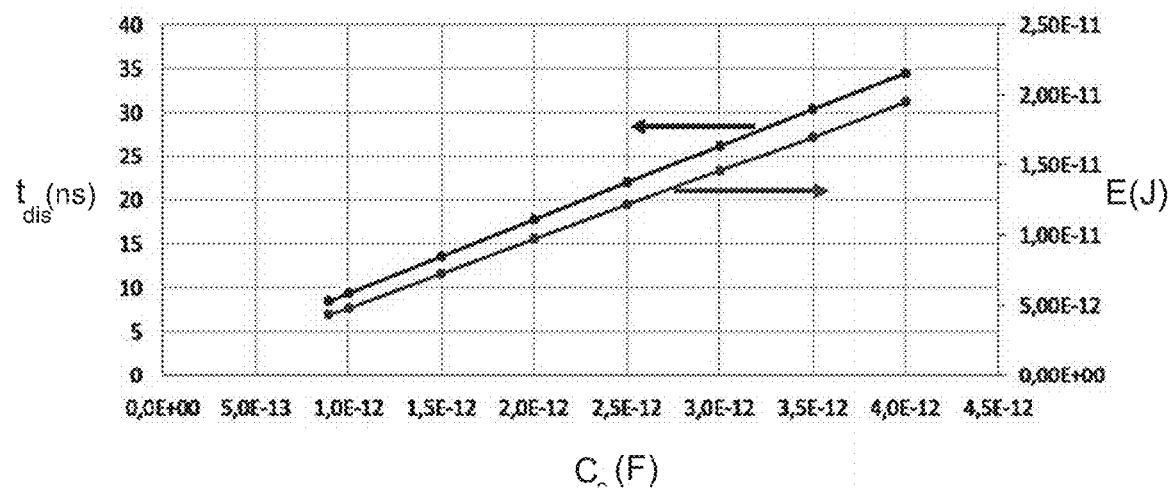
FIG. 14 shows how a response time of the memory, intervening during a reading operation, varies and how the energy consumed during this operation varies, as function of the capacitance of the conversion capacitor.

On the other hand, substantially increasing the value of Cc would be unfavourable from the standpoint of the minimum duration $t_{meas,min}$ of the reading operation, and in terms of electrical energy consumed (C.f.: FIG. 14), without however notably improving the width $\Delta V_R$ of the read window (C.f.: saturation effect of $\Delta V_R$, in FIG. 13)

For the capacitance $C_c$, choosing for example a value comprised between two times and thirty times the global parasitic capacitance $C_{par}^{tot}$ makes it possible to obtain a good compromise between these different constraints.

Regarding the additional resistor $R_{add}$, it may be chosen in such a way that the low total effective resistance $R_{tot}^{ON}$ is less than $V_{init}$ divided by $I_h$ (condition F2 given hereinabove), even less than $V_{th}^{SET}/I_h$ (condition F3 given hereinabove—which makes it possible to prevent an oscillatory regime), and greater than $V_{init}$ divided by $I_{prog}$ (condition F1—which makes it possible to limit the risks of rewriting at reading).

For the recall, the low total effective resistance $R_{tot}^{ON}$ is the total effective resistance in which the conversion capacitor 4 discharges when it is connected to the memory cell 20S, the cell having its low memory resistance $R_{cell}^{ON}$ (i.e.: memory element in its low resistive state, and selector in its conductive state). The low total effective resistance $R_{tot}^{ON}$ can be expressed approximately, depending on the additional resistor $R_{add}$ to be adjusted, as:

$$R_{tot}^{ON}=1/(1/R_{leak}^{mat}+1/R_{cell}^{ON})+R_{add}$$

Finally, regarding the reading time $t_{meas}$, it can be chosen in practice in such a way as to satisfy the condition F4 given hereinabove.

Numerical Examples

An example of dimensioning of the components of the interfacing device 3 is given below, for the purposes of illustration, in a case where the matrix of memory cells, of the OxRAM type, has the following characteristics:
  resistance of the memory element in the state SET: $R_{SET}^{RRAM}=10$ kΩ,
  resistance of the memory element in the state RESET: $R_{RESET}^{RRAM}=100$ kΩ,
  resistance of the selector (of the OTS type) in the on state: $R_{ON}^{sel}=1$ kΩ),
  holding current of the selector: $I_h=100$ μA.
  programming current: $I_{prog}=200$ μA,
  low voltage threshold $V_{th}^{SET}=3.5V$,
  high voltage threshold $V_{th}^{RESET}=4V$,
  threshold current of the selector $I_{th}=1$ μA,
  polarisation configuration of the V/2 type, with, for the partially selected cells, $V_{leak}=V_{th}^{SET}/2=1.75V$,
  leakage current at V/2: $I_{leak}=10^{-8}$ A,
  dimensions of the matrix: m×n=128×128, and
  elementary parasitic capacitance (fora cell) $C_{par}=0.5$ fF.

The conditions mentioned hereinabove, concerning the characteristics of the interfacing device 3, can then be satisfied by choosing the following values, for example:
  capacitance of the conversion capacitor. $C_c=2$ pF,
  initial voltage: $3.72$ V$<V_{init}<4.26$ V, satisfied here by choosing $V_{init}=4$ V.
  low total effective resistance: $17.5$ kΩ$<R_{tot}^{ON}<35$ kΩ, which can be obtained for example with $R_{add}=14.2$ kΩ (which then corresponds to a maximum current $I_{max}=139$ μA).

Moreover, with these parameters, the minimum read time $t_{meas,min}$ is 178 ns, with $t_{ch}=160$ ns and $t_{dis}=18$ ns. The intrinsic time of the read operation itself, which is $t_{dis}=18$ ns, is therefore short (on the other hand, the discharge time of the parasitic capacitors, $t_{ch}$, is rather substantial, and it would be interesting to reduce it).

By then choosing $t_{meas}=200$ ns, the following values are obtained, for the read result voltage: $V_{read}^{RESET}=3.8V$, $V_{read}^{SET}=2.5V$, and a read window $\Delta V_R=1.3V$.

In this example, the charge time of the parasitic capacitors $t_{ch}$ is higher than the intrinsic read time $t_{dis}$. In order to decrease $t_{ch}$, the value of the parasitic capacitors can be reduced (or, to a lesser degree, the initial voltage $V_{init}$ can be increased). A total read time less than 50 ns can for example be obtained by using the same parameters as hereinabove, but by decreasing the value of the elementary parasitic capacitor $C_{par}$ to 0.1 fF. In this case, the charge time of the parasitic capacitors is $t_{ch}=32$ ns while $t_{dis}=17$ ns, which allows for a minimum read time of 49 ns and a read window of about 1.4V for a reading time $t_{meas}=50$ ns.

Figure 12:
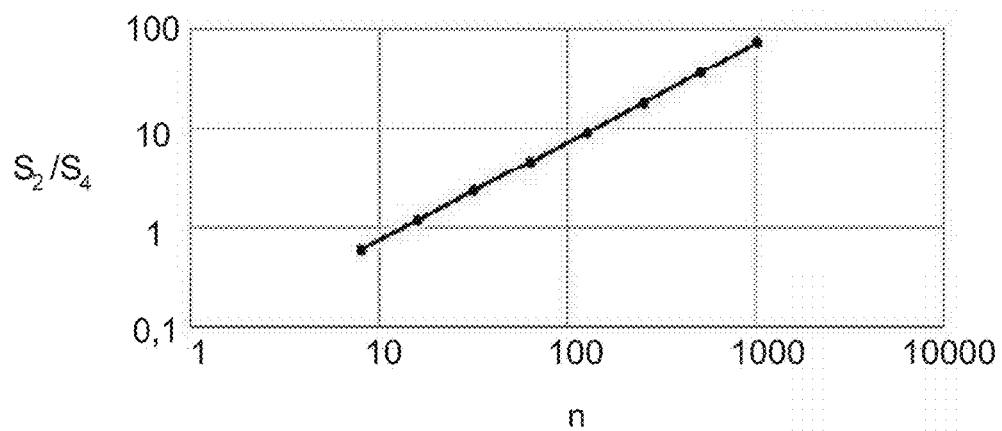
FIG. 12 shows the way in which a ratio between the surface occupied by the matrix and the surface occupied by the conversion capacitor varies, as a function of the dimension of the matrix.

FIG. 12 shows the ratio $S_2/S_4$ between the surface $S_2$ occupied by the matrix 2 and a surface $S_4$ occupied by the conversion capacitor 4, according to the number n of lines of the matrix, for a square matrix (n=m).

In terms of spatial density of memory points (for the matrix), and of capacitance per surface unit (for the conversion capacitor), the data in FIG. 12 corresponds to typical characteristics for a manufacturing method with fine etching (with a pitch between lines comprised for example between 20 and 40 nanometres).

Moreover, the value of capacitance $C_c$ corresponding to the surface $S_4$ is the smallest value of $C_c$ that makes it possible to satisfy the condition F5 given hereinabove, in the same conditions as for the complete numerical example presented hereinabove (in particular, for $V_{init}=4V$).

As can be seen in this figure, except for matrices of very small dimensions, the ratio $S_2/S_4$ is greater than 1 (for the numerical example given hereinabove, it is equal to 10, for example). The conversion capacitor thus occupies a surface smaller than that of the matrix.

It can then be integrated above or below the matrix, in line with the latter, without extending beyond the surface occupied by the matrix 2. This makes it possible to integrate the conversion capacitor as close as possible to the matrix, and without increasing the size of the memory 1.

The increase in the ratio $S_2/S_4$ with the dimension n, visible in FIG. 12, can be explained as follow. The surface $S_2$ of the matrix increases as $n^2$, while the global parasitic capacitance $C_{par}^{tot}$, and therefore the minimum value of the capacitance $C_c$, increase as n (more precisely, in proportion to $2n-1$), and so the ratio $S_2/S_4$ increases finally in proportion to n.

FIGS. 13 and 14 show values obtained for the read window $\Delta V_R$ (expressed in volts, V), the discharge time $t_{dis}$ (in nanoseconds), and the energy E consumed during a read operation of a state SET (expressed in joules), according to the value of the capacitance $C_c$ of the conversion capacitor (in Farads). These values are obtained in the same conditions as for the complete numerical example presented hereinabove (in particular, $C_{par}=0.5$ fF, for these figures).

As already mentioned, it is observed that the read window $\Delta V_R$ beneficially increases when $C_c$ increases, but that this is also accompanied by an increase in the discharge time $t_{dis}$ ("intrinsic" read time), and in the energy E consumed.

Figure 1:
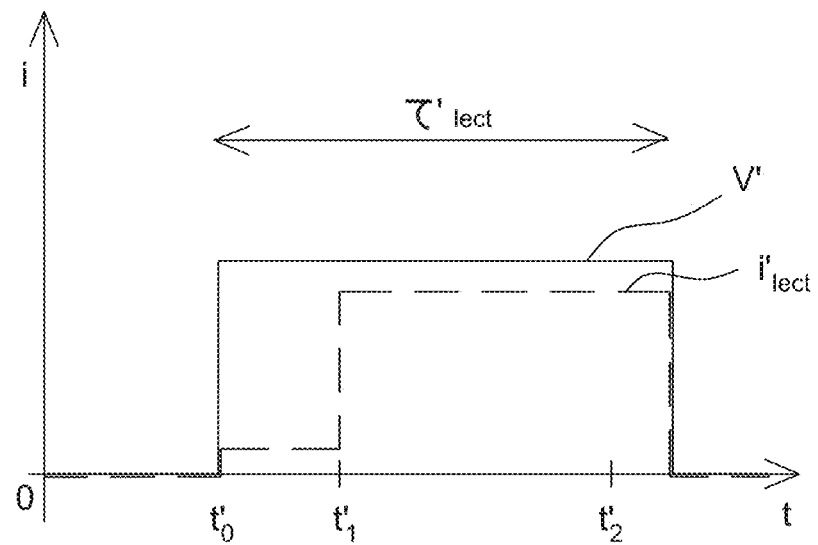
FIG. 1 schematically shows a read voltage pulse applied to a resistive memory cell in order to read it, as well as a read current flowing through the cell, in response to this pulse.
Figure 2:
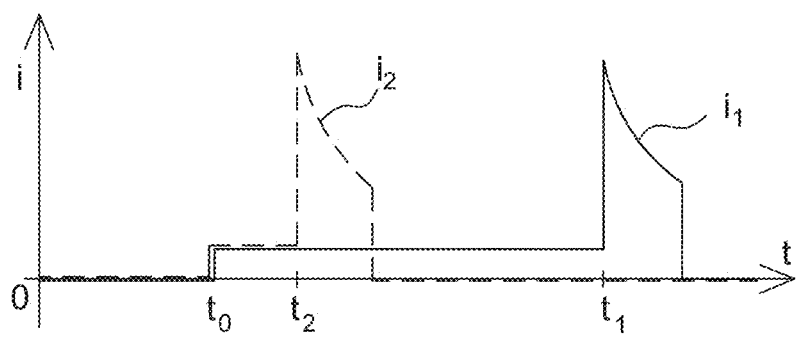
FIG. 2 schematically shows a current pulse flowing through a memory cell during a reading operation carried out by means of an interfacing device according to the present technology.
Figure 15:
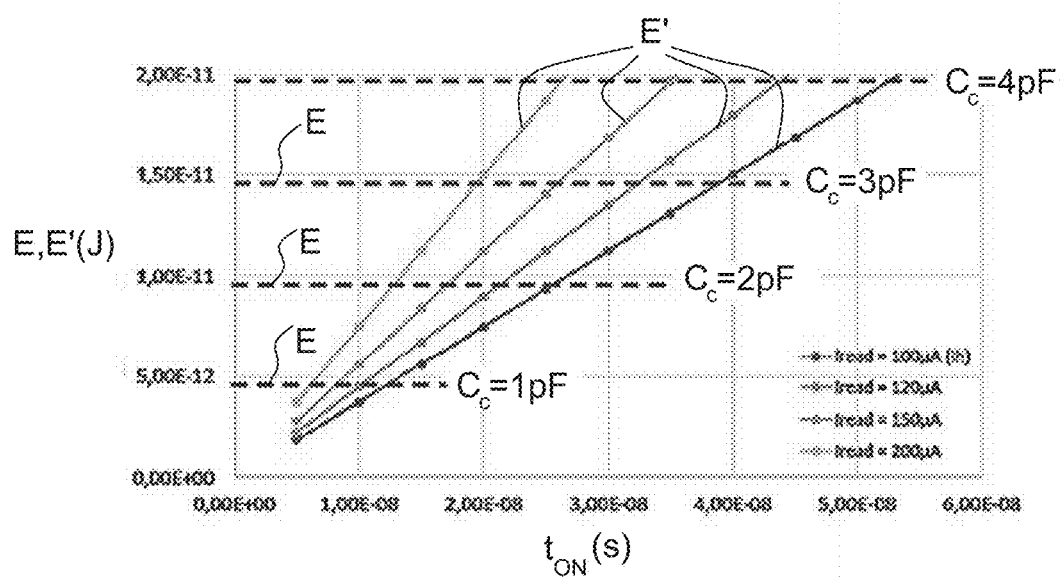
FIG. 15 shows values of the energy consumed during a reading operation carried out either thanks to the interfacing device of FIG. 3, or conventionally.

FIG. 15 shows:
  the energy E is consumed during a read operation of a state SET (in Joules) for the particular interfacing device 3 that has just been presented, and
  the energy E' consumed during a read operation of a state SET (in Joules) for a conventional interfacing device, wherein the reading would be carried out by applying a constant read voltage (see FIG. 1), here equal to 4V.

The four values of energy E, given respectively for $C_c=1$, 2, 3 and 4 pF, are those that correspond to the curve of FIG. 14.

For the energy E', 4 curves are shown, associated respectively with a read current $I_{read}$ of 100, 120, 150 and 200 microamperes. For each one of these curves, the energy E' is represented as a function of an average duration in the on state $t_{ON}$. This duration corresponds to the average time during which the memory cell (and in particular its selector) is conductive.

By way of example, if the incubation time mentioned hereinabove fluctuates, from one cell and from one reading to the other, between 0 ns and 50 ns, for example a read pulse (FIG. 1) of 50 ns at least will be required, which leads to an average duration in the on state $t_{ON}$ of about 25 ns (this is a highly simplified example, but in any case, in practice, $t_{ON}$ is typically comprised between about ten and a few tens of ns). In this case, it is easy to see that the values of energy E' obtained by a conventional read technique are higher than the energy E consumed with the interfacing device 3 that has just been presented, for the value $C_c=2$ pF mentioned hereinabove. And this conclusion remains valid for the different values of $t_{ON}$ considered, optionally adapting the value of $C_c$ if necessary.

In addition to the memory 1 that has just been described, the present technology relates to a method for interfacing such a memory 1, comprising the following steps:

controlling the first and second switches 5, 6 to connect the source 7 to the conversion capacitor 4, the conversion capacitor then being disconnected from the line and column electrical tracks $L_i$, $C_j$, in such a way as to charge the conversion capacitor 4 to an initialisation voltage $V_{init}$, then controlling the first and second switches 5, 6 to disconnect the source 7 from the conversion capacitor 4 and to connect this capacitor between the line electrical track $L_i$ and the column electrical track $C_j$.

This method can in particular be a reading method, wherein:

the first and second switches 5, 6 are to disconnect the source 7 from the conversion capacitor 4 and to connect the capacitor between the line electrical track $L_i$ and the column electrical track $C_j$, during the memory cell read time $t_{meas}$ mentioned hereinabove, the method then comprising a step of acquiring the read result voltage $V_R$ at the terminals 11, 12 of the conversion capacitor 4, by means of the voltage measuring device 8.

This method can then comprise a step of determining the data (0 or 1, for example) stored in the memory cell 20S, according to the read result voltage $V_R$.

The invention claimed is:

1. A memory comprising:
a matrix of resistive memory cells with:
line electrical tracks,
column electrical tracks, and
resistive memory cells located at crossings between the line electrical tracks and the column electrical tracks, each memory cell being connected between one of the line electrical tracks and one of the column electrical tracks,
an interfacing device for interfacing said matrix, the interfacing device comprising at least one conversion capacitor, a voltage measuring device connected to terminals of the conversion capacitor, an electrical source, a first switch, a second switch and a control module, the interfacing device being configured to execute the following steps:
step a): connecting the conversion capacitor to the source by the second switch to charge the conversion capacitor,
after step a), step b) successively comprising:
disconnecting the conversion capacitor from the source, and connecting the conversion capacitor between one of the line electrical tracks and one of the column electrical tracks, by the first switch, to apply an electrical voltage to a cell to be read, said cell being located at a crossing of said line electrical track and said column electrical track,
acquiring a read result voltage, at the terminals of the conversion capacitor, by the voltage measuring device, and
determining a resistive state of said cell, by the control module, based on said read result voltage.

2. The memory according to claim 1, wherein the interfacing device comprises an additional resistor connected in series with the conversion capacitor.

3. The memory according to claim 1, wherein the conversion capacitor has a capacitance greater than a global parasitic capacitance, the global parasitic capacitance being representative of an effective electrical capacitance of the portion of the matrix corresponding to said line electrical track and to said column electrical track.

4. The memory according to claim 1, wherein the control module is configured to control the first and second switches so as to execute steps a) and b).

5. The memory according to claim 4, wherein the control module is further configured to:
in step a), control the second switch, or the source, so as to charge the conversion capacitor to a given initialisation voltage,
in step b), control the first and second switches so as to disconnect the source from the conversion capacitor, then to connect the conversion capacitor between said line electrical track and said column electrical track, during a predetermined memory cell reading time, before the acquisition of said read result voltage.

6. The memory according to claim 5,
wherein each memory cell comprises a memory element having at least one high resistive state and one low resistive state, as well as a selector arranged in series with the memory element, the selector being electrically conductive when a first voltage at its terminals is greater than a given threshold, and being electrically insulating otherwise,
and wherein, when a second voltage, applied at the terminals of the memory cell, is comprised between a low voltage threshold and a high voltage threshold:
if the memory element is in its low resistive state, then, the selector becomes electrically conductive and the memory cell then has a low memory resistance,
while if the memory element is in its high resistive state, then, the selector remains electrically insulating and the memory cell then has a high memory resistance.

7. The memory according to claim 6, wherein said initialisation voltage is:
greater than said low voltage threshold, multiplied by a load balancing compensation coefficient, and
less than said high voltage threshold, multiplied by said coefficient,
the load balancing compensation coefficient being equal to the sum of the capacitance of the conversion capacitor and of a global parasitic capacitance, divided by the capacitance of the conversion capacitor, with the global parasitic capacitance being representative of the effective electrical capacitance of the portion of the matrix corresponding to said line electrical track and to said column electrical track.

8. The memory according to claim 7, wherein the reading time is greater than: a high total effective resistance, multiplied by said global parasitic capacitance, the high total effective resistance being a total effective resistance in which the conversion capacitor discharges when it is connected to said line electrical track and to said column electrical track, the memory cell, located at the crossing of this line and of this column, having its high memory resistance.

9. The memory according to claim 6,
wherein the interfacing device comprises an additional resistor connected in series with the conversion capacitor,
wherein the selector is electrically conductive with the further condition that an electrical current that passes through the selector remains greater than a holding current,
and wherein the additional resistor is such that a low total effective resistance of the memory is less than said initialisation voltage divided by the holding current of the selector, the low total effective resistance being the total effective resistance in which the conversion capacitor discharges when it is connected to said line electrical track and to said column electrical track, the memory cell, located at the crossing of this line and of this column, having its low memory resistance.

10. The memory according to claim 9, wherein the additional resistor is such that the low total effective resistance of the memory is, furthermore, less than said low voltage threshold divided by the holding current of the selector.

11. The memory according to claim 1, wherein the conversion capacitor is located above or below the matrix of memory cells and extends parallel to the matrix, the matrix and the conversion capacitor being superimposed on each other.

12. A method for interfacing a memory in accordance with claim 1, comprising the following steps:

step a): connecting the conversion capacitor to the source by the second switch to charge the conversion capacitor, then step b):
disconnecting the conversion capacitor from the source, and connecting the conversion capacitor between one of the line electrical tracks and one of the column electrical tracks, by the first switch, then
acquiring a read result voltage, at the terminals of the conversion capacitor, by the voltage measuring device, then
determining a resistive state of said cell, by the control module, based on said read result voltage.

13. The method according to claim 12, the memory comprising the voltage measuring device connected to the terminals of the conversion capacitor, wherein:
in step a), the second switch, or the source, is controlled so as to charge the conversion capacitor to a given initialisation voltage,
in step b), the first and second switches are controlled so as to disconnect the source from the conversion capacitor, then in such a way as to connect the conversion capacitor between said line electrical track and said column electrical track, during a predetermined memory cell reading time, before the acquisition of said read result voltage.

* * * * *